United States Patent
Chao et al.

(10) Patent No.: US 8,546,950 B2
(45) Date of Patent: Oct. 1, 2013

(54) SEMICONDUCTOR PACKAGE AND MANUFACTURING METHOD THEREOF

(75) Inventors: Shin-Hua Chao, Kaohsiung (TW); Chao-Yuan Liu, Kaohsiung (TW); Hui-Ying Hsieh, Yanchao Township, Kaohsiung County (TW); Chih-Ming Chung, Dashe Township, Kaohsiung County (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 239 days.

(21) Appl. No.: 12/947,390

(22) Filed: Nov. 16, 2010

(65) Prior Publication Data
US 2012/0032341 A1 Feb. 9, 2012

(30) Foreign Application Priority Data
Aug. 5, 2010 (TW) .............................. 99126159 A

(51) Int. Cl.
*H01L 23/48* (2006.01)

(52) U.S. Cl.
USPC ........... 257/774; 257/678; 257/734; 257/786; 257/E21.506; 257/E23.001

(58) Field of Classification Search
USPC ... 257/678–733, 787–796, E23.001–E23.194
See application file for complete search history.

(56) References Cited

U.S. PATENT DOCUMENTS

| | | | |
|---|---|---|---|
| 2009/0203171 A1* | 8/2009 | Takemasa et al. | 438/113 |
| 2010/0264552 A1* | 10/2010 | Nakasato et al. | 257/778 |

FOREIGN PATENT DOCUMENTS

| | | |
|---|---|---|
| CN | 1387252 A | 12/2002 |
| CN | 101097904 A | 1/2008 |
| JP | 11-026641 A | 1/1999 |

* cited by examiner

*Primary Examiner* — Mamadou Diallo
(74) *Attorney, Agent, or Firm* — Muncy, Geissler, Olds & Lowe, PLLC

(57) ABSTRACT

A semiconductor package and a manufacturing method thereof are provided. The semiconductor package includes a substrate, a semiconductor element, a package body and a conductive part. The substrate has an electrical contact. The semiconductor element is disposed on the substrate. The package body covers the semiconductor element and defines a through hole from which the electrical contact is exposed. Wherein, the package body includes a resin body and a plurality of fiber layers. The fiber layers are disposed in the resin body and define a plurality of fiber apertures which is arranged as an array. The conductive part is electrically connected to the substrate through the through hole.

19 Claims, 8 Drawing Sheets

SEMICONDUCTOR PACKAGE AND MANUFACTURING METHOD THEREOF

This application claims the benefit of Taiwan application Serial No. 99126159, filed Aug. 5, 2010, the subject matter of which is incorporated herein by reference.

BACKGROUND OF THE INVENTION

1. Field of the Invention

The invention relates in general to a semiconductor package and a manufacturing method thereof, and more particularly to a semiconductor package with fiber structure and a manufacturing method thereof.

2. Description of the Related Art

The conventional semiconductor package at least includes a substrate, a chip, a plurality of solder balls and a sealant. The chip is disposed on the substrate. The sealant, which envelops the chip by way of potting process, further has a plurality of through holes from which the pads disposed on the substrate are exposed. The solder balls are electrically connected to the substrate through the pads disposed on the through hole, and an external circuit can be electrically connected to the chip through the solder balls.

In general, the sealant can be made from materials such as novolac-based resin, epoxy-based resin, silicone-based resin or other suitable capping agents.

The through hole of sealant is normally formed by laser process. However, some additives with poor workability are normally added to the above materials for sealant. As a result, the sealant is hardened, the formation of the through hole becomes more difficult, and the inner lateral wall of the through hole has a larger gradient. Due to the larger gradient of the inner lateral wall of the through hole, the opening of the through hole on the sealant must be large enough for exposing the pads of the substrate. Thus, the number of the through holes is restricted, and the number of I/O contacts of the conventional semiconductor package can hardly be increased.

SUMMARY OF THE INVENTION

The invention is directed to a semiconductor package and a manufacturing method thereof. The package body of the semiconductor package has better workability, so that the number of I/O contacts can be increased.

According to a first aspect of the present invention, a semiconductor package and a manufacturing method thereof are provided. The semiconductor package includes a substrate, a semiconductor element, a package body and a conductive part. The substrate has an electrical contact. The semiconductor element is disposed on the substrate. The package body covers the semiconductor element and defines a through hole from which the electrical contact is exposed. Wherein, the package body includes a resin body and a plurality of fiber layers. The fiber layers are disposed in the resin body and define a plurality of fiber apertures which is arranged as an array. The conductive part is electrically connected to the substrate through the through hole.

According to a second aspect of the present invention, a method for manufacturing a semiconductor package is provided. The manufacturing method includes the following steps. Firstly, a substrate having an electrical contact is provided. Next, a semiconductor element is disposed on the substrate. Then, a conductive part is formed on the electrical contact. After that, a plurality of resin layers and a plurality of fiber layers are stacked on the substrate, wherein the resin layers and the fiber layers expose the semiconductor element, and the fiber layers define a plurality of fiber apertures arranged as an array. Afterwards, a pressure and a heat are applied to the resin layers and the fiber layers to melt the resin layers, and the melted resin layer cools and solidifies as a resin body, which forms a package body with the fiber layers. Following that, a through hole passing through the resin layer and the fiber layers is formed, wherein the electrical contact is exposed from the through hole. Lastly, the substrate and the package body are singulated.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
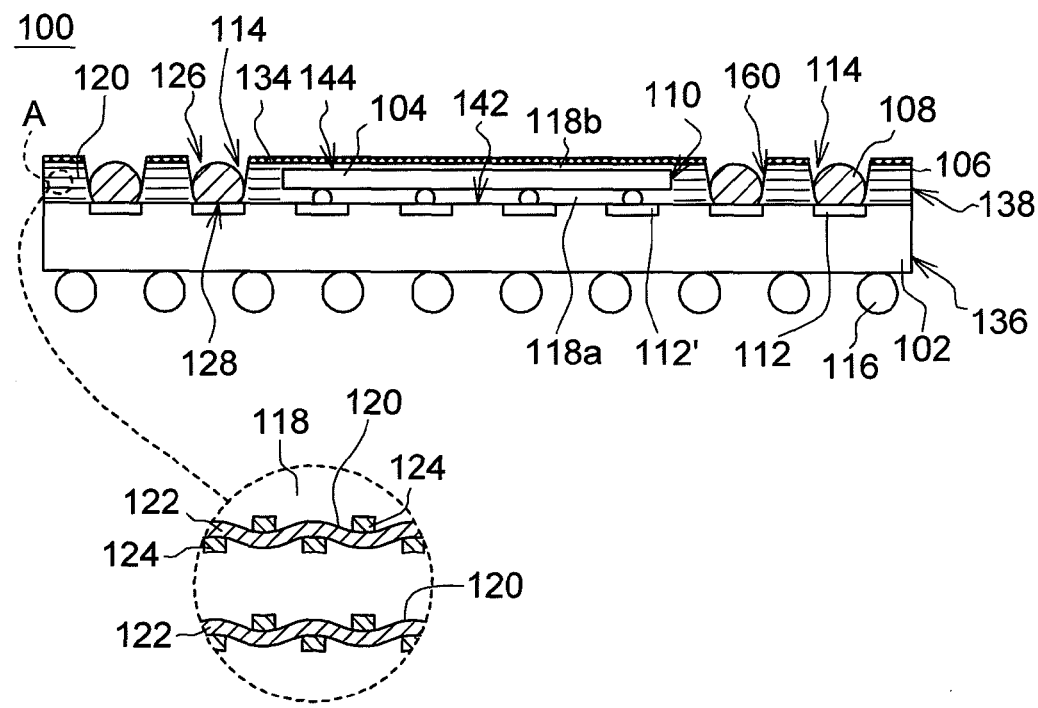
FIG. 1 shows a cross-sectional view of a semiconductor package according to an embodiment of the invention.

Referring to FIG. 1, a cross-sectional view of a semiconductor package according to an embodiment of the invention is shown. The semiconductor package 100 includes a substrate 102, a semiconductor element 104, a package body 106, a conductive part 108, a metal layer 134 and a plurality of solder balls 116.

The metal layer 134 can be realized by such as a copper foil with a thickness ranging between 3 μm and 72 μm, but the invention is not limited thereto. The metal layer 134 is disposed on the outmost layer of the semiconductor package 100 to quickly dissipate the heat generated by the semiconductor package 100. The metal layer 134 further enhances the structural strength of the semiconductor package 100.

The semiconductor element 104 can be realized by a chip, such as a flip chip. The semiconductor element 104 is disposed on the upper surface 142 of the substrate 102 and electrically connected to the substrate 102.

The substrate 102 has a plurality of electrical contacts 112. The electrical contacts 112 can be realized by such as pads. The solder balls 116 are disposed on the substrate 102, wherein the substrate 102 can be electrically connected to an external circuit (not illustrated) through the solder balls 116. The solder balls 116 can be electrically connected to the electrical contacts 112 through the through hole (not illustrated) or the conductive layer (not illustrated) of the substrate 102.

The package body 106 defines a plurality of through holes 114, wherein each exposes a corresponding electrical contact 112 and a corresponding conductive part 108. The conductive part 108 can be realized by such as a solder ball disposed in the through hole 114 and electrically connected to the electrical contact 112. An external circuit (not illustrated) can be docked to the conductive part 108 to be electrically connected to the semiconductor element 104, wherein the external circuit can be realized by such as a circuit board or other semiconductor elements.

Examples of the materials of the substrate 102 include such as epoxy-based resin and polyester resin. The package body 106 includes a resin body 118 and a plurality of fiber layers 120 as indicated in an enlargement view of the portion A of FIG. 1. Examples of the materials of the resin body 118 also include epoxy-based resin and polyester resin, and examples of the materials of the fiber layers 120 include glass fiber, carbon fiber, boron fiber, or other synthetic fibers. Since the substrate 102 and the resin body 118 are made from similar or same materials, the coefficient of thermal expansion (CTE) of the substrate 102 is similar to that of the package body 106, and the entire semiconductor package 100 has smaller warpage. Thus, even in a thinner area of the substrate 102, the warpage of the semiconductor package 100 still can be controlled to be within a predetermined range.

A portion 118a of the resin body 118 is interposed between the semiconductor element 104 and the substrate 102 and covers the upper surface 144 and lateral surface 110 of the semiconductor element 104. That is, the entire semiconductor element 104 is enveloped by the package body 106, but the invention is not limited to such exemplification. In an implementation of the invention, the upper surface 144 of the semiconductor element 104 is exposed instead of being covered by the package body 106.

Figures 2, 3:
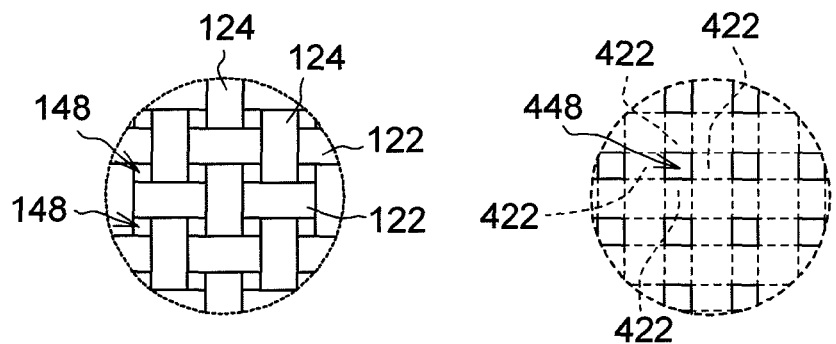
FIG. 2 shows a top view of the portion A of FIG. 1.
FIG. 3 shows a top view of the fiber structure of a semiconductor package according to other implementations of the invention.

The fiber layers 120 are disposed in the resin body 118, wherein each fiber layer 120 includes a plurality of fiber structures. The fiber structures are bar-shaped glass fiber, and are formed by a plurality of first sub-fiber structures 122 and a plurality of second sub-fiber structures 124. Referring to FIG. 2, a top view of the portion A of FIG. 1 is shown. The first sub-fiber structures 122 and the second sub-fiber structures 124 are interlaced to form a plurality of fiber apertures arranged as an array 148.

In an implementation, the first sub-fiber structures 122 and the second sub-fiber structures 124 are interlaced, and are mutually fixed at the interlacing part. For other implementations, referring to FIG. 3, a top view of the fiber structure of a semiconductor package according to other implementations of the invention is shown. In FIG. 3, each fiber layer 420 is realized by a sheet-like glass fiber layer, which defines a plurality of fiber structures 422 to form a plurality of fiber apertures arranged as an array 448. Also, the fiber structures 422 are connected to form a sheet-like glass fiber layer integrally formed in one piece.

Since the package body 106 has better workability, the inner lateral wall 160 (illustrated in FIG. 1) of the through hole 114 has a smaller gradient. In comparison to the through hole of a conventional semiconductor package, the size difference between the top opening 126 and the bottom opening 128 of the through hole 114 of FIG. 1 is smaller (that is, the inner lateral wall 160 of the through hole 114 has a smaller gradient). In other words, given that the bottom opening 128 is the same, the top opening 126 has a smaller size, and more through holes 114 can be formed with a higher density to exposes more conductive parts 108. That is, more I/O electrical contacts can be formed.

Figure 4:
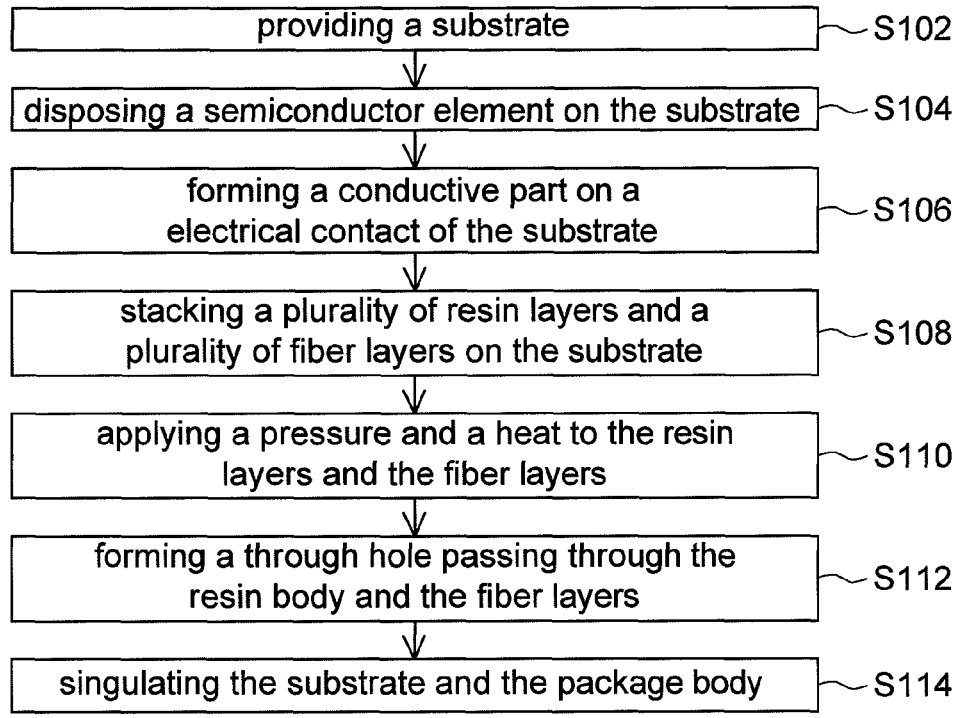
FIG. 4 shows a flowchart of a method for manufacturing semiconductor package according to an embodiment of the invention.

Herebelow, the method for manufacturing the semiconductor package 100 of FIG. 1 are elaborated with FIG. 4 and FIGS. 5A-5E. FIG. 4 shows a flowchart of a method for manufacturing semiconductor package according to an embodiment of the invention. FIGS. 5A-5E show manufacturing processes of the semiconductor package of FIG. 1.

Figure 5A:
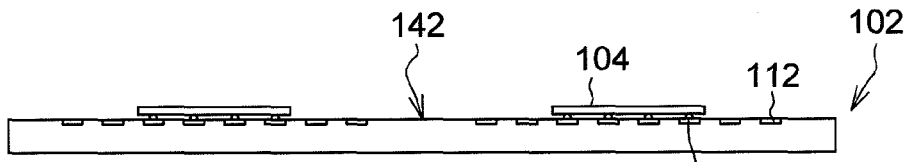
FIGS. 5A-5E show manufacturing processes of the semiconductor package of FIG. 1.

Firstly, the method begins at step S102, the substrate 102 as indicated in FIG. 5A is provided, wherein the substrate 102 has a plurality of electrical contacts 112 and 112'.

Next, the method proceeds to step S104, as indicated in FIG. 5A, a plurality of semiconductor elements 104 is disposed on the upper surface 142 of the substrate 102. The semiconductor element 104 is electrically connected to the electrical contact 112' through the solder balls.

Figure 5B:
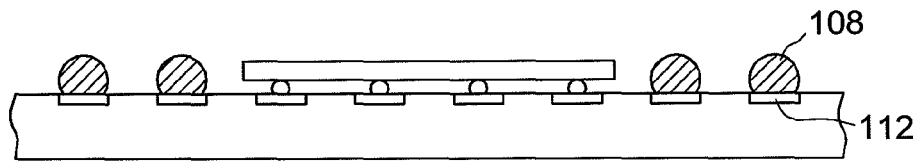

Then, the method proceeds to step S106, as indicated in FIG. 5B, a conductive part 108 is formed on a corresponding electrical contact 112. FIGS. 5B-5E only illustrate the range of one semiconductor element 104.

The present step S106, the implantation step can be performed before the reflowing step so as to form the conductive part 108 as indicated in FIG. 5B. The appearance of the reflowed conductive part 108 is approximately two thirds of a spheroid, and the remaining one thirds of the spheroid is melted to the electrical contact 112 so that the conductive part 108 is firmly coupled to the electrical contact 112.

Figure 5C:
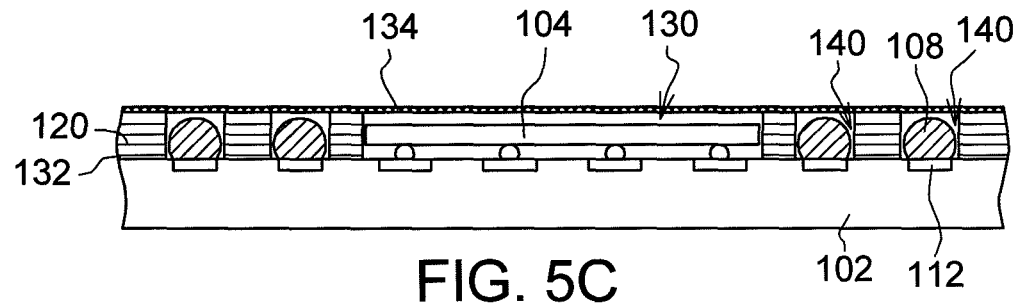

Afterwards, the method proceeds to step S108, a plurality of resin layers 132 and a plurality of fiber layers 120 are stacked on the substrate 102 as indicated in FIG. 5C, wherein, the resin layers 132 and the fiber layers 120 are interlaced in a top-down manner. For example, only one single fiber layer 120 is contained between two resin layers 132; only one single resin layers 132 is contained between two fiber layers 120; many fiber layers 120 but not any resin layers 132 are contained between two resin layers 132; or, many resin layers 132 but not any fiber layers 120 are contained between two fiber layers 120. In other implementations, the resin layers 132 and the fiber layers 120 can be stacked and interlaced freely.

Prior to step S108, a plurality of first apertures 130 and a plurality of second apertures 140 can be formed on the resin layers 132 and the fiber layers 120. Following step S108, the semiconductor element 104 is exposed from the first aperture 130, and the conductive parts 108 and the electrical contacts 112 are exposed from the second apertures 140.

Also, following step S108, the metal layer 134 as indicated in FIG. 5C can be stacked on the resin layers 132 and the fiber layers 120.

Figure 5D:
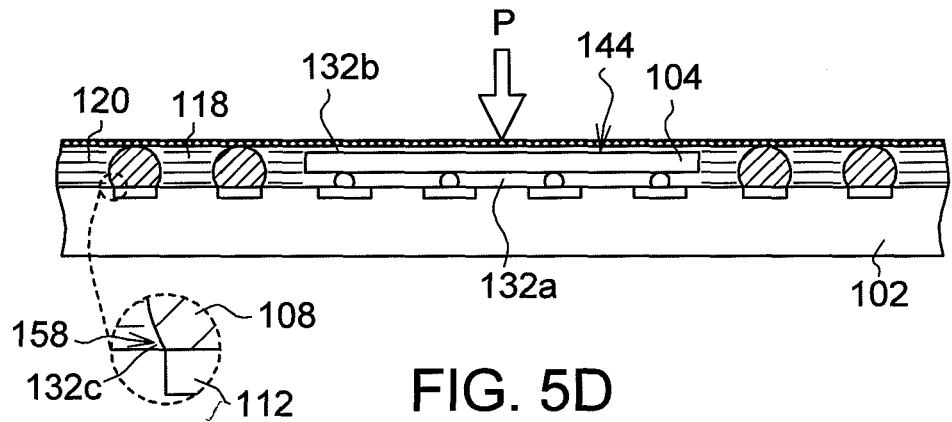

After that, the method proceeds to step S110, as indicated in FIG. 5D, through the metal layer 134, a pressure P is applied to the resin layers 132 and the fiber layers 120 to compress the resin layers 132 and the fiber layers 120, and a heat is applied to the resin layers 132 and the fiber layers 120 to melt the resin layers 132. A portion of 132*a* of the melted resin layers 132 is interposed between the semiconductor element 104 and the substrate 102 to form an underfill, wherein a portion 132*b* of the melted resin layers 132 covers the upper surface 144 and lateral surface 110 of the semiconductor element 104 (the lateral surface 110 is illustrated in FIG. 1).

Furthermore, in step S110, the enveloping layer used for enveloping the semiconductor element 104 and the filling layer interposed between the semiconductor element 104 and the substrate 102 are formed at the same time.

Besides, the melted resin layers 132 envelops the conductive part 108, and a portion 132*c* of the melted resin layers 132 is interposed at the junction 158 between the conductive part 108 and the electrical contact 112. A portion 132*c* of the resin layers 132 firmly holds the conductive part 108, so that the conductive part 108 is more firmly disposed on the electrical contact 112. The melted resin layers 132 cool and solidify as the resin body 118 as indicated in FIG. 1, wherein the resin body 118 and the fiber layers 120 form a package body 106 (illustrated in FIG. 1). The portion 132*a* of the melted resin layers 132 cools and solidifies as the portion 118*a* of the resin body 118 of FIG. 1, and the portion 132*b* of the melted resin layers 132 cool and solidify as the portion 118*b* of the resin body 118 of FIG. 1.

In an implementation, an underfill can be formed between the semiconductor element 104 and the substrate 102 in step S104 prior to the subsequent process.

In an implementation, a plurality of metal layer apertures (not illustrated) is defined at the position of the metal layer 134 of FIG. 5C corresponding to the conductive part 108. After the resin layers 132 and the fiber layers 120 are compressed through the metal layer 134, the conductive part 108 can be exposed from the metal layer 134 through the metal layer apertures, so that the conductive part 108 of the final semiconductor package 100 can be exposed from the top opening 126 of the through hole 114. Thus, the electrical contact area between the conductive part 108 and a circuit element is increased, and the quality of electrical connection between the conductive part 108 and the circuit element is improved. Herein, the circuit element can be realized by a circuit board, another semiconductor package or a chip, such as a flip chip.

Figure 5E:
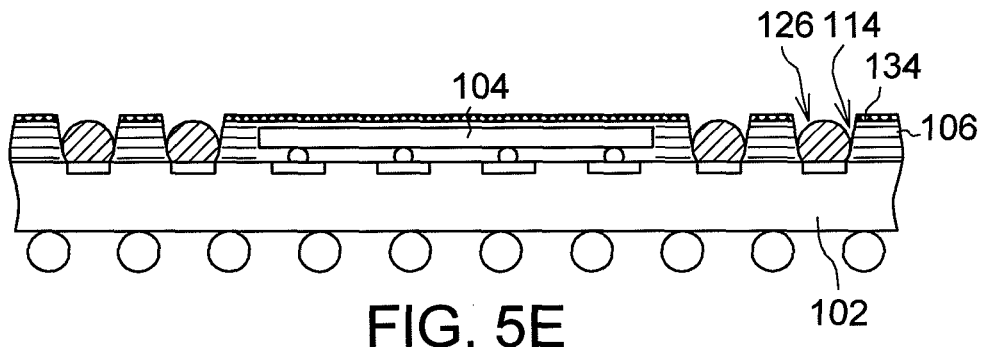

Following that, the method proceeds to step S112, as indicated in FIG. 5E, a plurality of through holes 114 is formed on the package body 106 of FIG. 5D by way of mechanical or laser process. Each through hole 114 passes through the metal layer 134, the resin body 118 and the fiber layers 120 to exposes the corresponding electrical contact 112 and the corresponding conductive part 108.

Since the top opening 126 of each through hole 114 has a smaller area, the distance between two adjacent through holes 114 is reduced, and more through holes 114 can be formed with a higher density and more conductive parts 108 (I/O electrical contacts) can be formed.

Since the through holes 114 are formed after the formation of the conductive part 108, the formation of the conductive parts 108 will not be affected despite the top opening 126 of each through hole 114 has a smaller area. Thus, a plurality of neighboring conductive parts 108 can be formed first, and then a plurality of corresponding through holes 114 is formed to expose the conductive parts 108. Since the conductive parts 108 can be closely adjoined to each other, more conductive parts 108 can be formed, and the number of the I/O electrical contacts of the semiconductor package 100 can be increased.

In addition, due to the superior workability of the package body 106, after the laser process, the inner lateral wall 160 of the through hole 114 has a smaller gradient, the area of the top opening 126 can be reduced, and more through holes 114 can be formed.

In the above exemplification, the semiconductor package 100 of FIG. 1 includes a metal layer 134 in the above exemplification, but the invention is not limited thereto. In an implementation, the metal layer 134 can be removed by way of peeling or etching after step S112 is completed; or the metal layer 134 can be removed between steps S110 and S112.

Lastly, the method proceeds to step S114, the substrate 102 and the package body 106 of FIG. 5E are singulated along the portion between two adjacent semiconductor elements 104.

Since the singulation path (not illustrated) passes through the substrate 102 and the package body 106 which are stacked together, the outer lateral surface 136 of the substrate 102 is aligned with the outer lateral surface 138 of the package body 106 as indicated in FIG. 1.

Besides, prior to or following step S114, the solder balls 116 as indicated in FIG. 1 can be formed on the substrate 102 to form a plurality of semiconductor packages 100 as indicated in FIG. 1.

Figure 6:
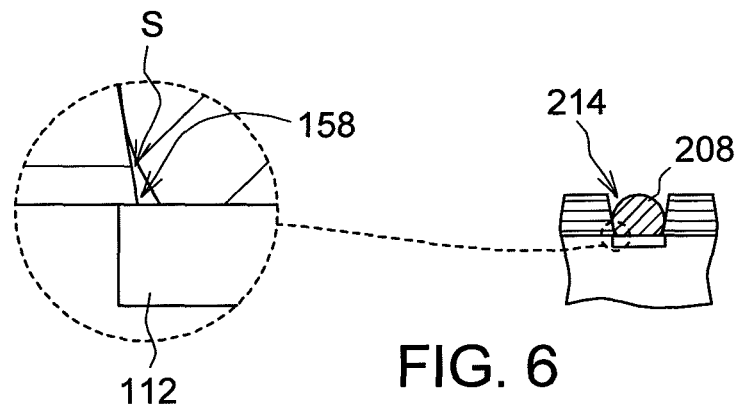
FIG. 6 shows a conductive part of a semiconductor package according to other implementations of the invention.

In the above exemplification, the conductive parts 108 are formed before the formation of the through holes 114 in the above exemplification, but the invention is not limited thereto. Referring to FIG. 6, a conductive part of a semiconductor package according to other implementations of the invention is shown. In other implementations, the conductive parts 208 can be formed after the formation of the through hole 114. Under such circumstance, a space S is defined between the junction 158 between the through hole 214 and the electrical contacts 112 and the conductive parts 208, wherein the space is not totally filled with the melted resin layer, however, the invention is not limited to the above exemplification.

Figure 7:
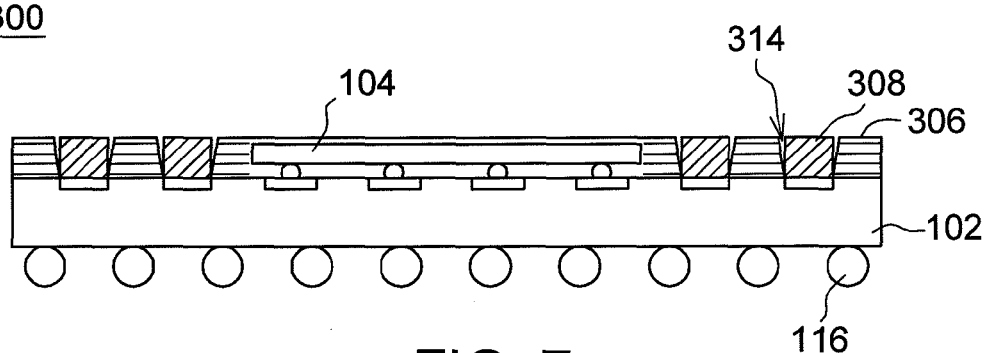
FIG. 7 shows a cross-sectional view of the semiconductor package according to another embodiment of the invention embodiment.

Referring to FIG. 7, a cross-sectional view of the semiconductor package according to another embodiment of the invention embodiment is shown. The semiconductor package 300 includes a substrate 102, a semiconductor element 104, a package body 306, a conductive part 308 and a plurality of solder balls 116. The conductive part 308 of the semiconductor package 300 can be realized by a conductive pillar such as a copper pillar. The technological features of the package body 306 are similar to the package body 106 of FIG. 1, and the similarities are not repeated here.

Herebelow, the method for manufacturing the semiconductor package 300 of FIG. 6 is elaborated with the flowchart of FIG. 4. In the method for manufacturing the semiconductor package 300, step S106 can be postponed until step S112 is completed, that is, the conductive part 308 is formed after the formation of the through holes 314 of the package body 306. In step S106, the cylindrical conductive part 308 can be formed by way of electroplating process, however the invention is not limited to the above exemplification. In other implementations, the conductive parts, which are columnar and fill the entire through hole 314, can be formed by way of coating with a conductive paste. Here, the conductive paste can be realized by such as copper paste or tin paste.

Figure 8:
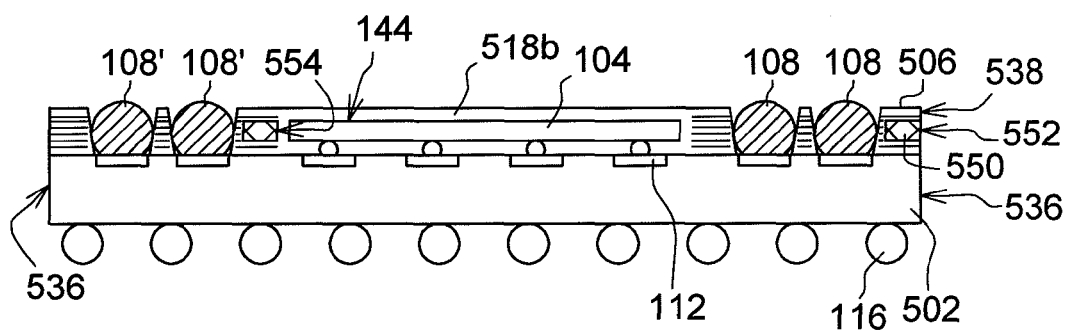
FIG. 8 shows a cross-sectional view of the semiconductor package according to yet another embodiment of the invention embodiment.

In the above exemplification, the semiconductor package 300 omits the metal layer 134 used in the embodiment as indicated in FIG. 1. However, in other implementations, the semiconductor package 300 may include a metal layer, wherein the structure and formation method of the metal layer are similar to those of the metal layer 134 used in the embodiment as indicated in FIG. 1, and the similarities are not repeated here. Referring to FIG. 8, a cross-sectional view of the semiconductor package according to yet another embodiment of the invention embodiment is shown. The semiconductor package 500 includes a substrate 502, a semiconductor element 104, a surrounding portion 550, solder balls 116 and a package body 506. The surrounding portion 550 enhances the structural strength of the semiconductor package 500 and decreases the warpage of the semiconductor package 500. The surrounding portion 550 further defines a surrounding portion aperture 554, wherein the semiconductor element 104 is disposed inside the surrounding portion aperture 554.

The surrounding portion 550 is embedded inside the package body 506 but the outer lateral surface 552 of the surrounding portion 550 is exposed, so that the heat generated by the semiconductor element 104 can be quickly dissipated through the outer lateral surface 552 of the surrounding portion 550. However, the invention is not limited to the above exemplification. In an implementation, the surrounding portion 550 is completely enveloped by the package body 506 instead of being exposed.

Figure 9:
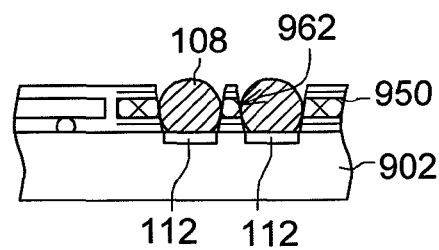
FIG. 9 shows a partial cross-sectional view of a semiconductor package according to other implementations of the invention.

The conductive parts 108 can be disposed between the surrounding portion 550 and the semiconductor element 104 such as the conductive parts 108 positioned at the right of FIG. 8. Or, the conductive parts 108 can be disposed adjacent to the outer lateral surface 536 of the substrate 502 such as the conductive parts 108' positioned at the left of FIG. 8. Or, all conductive parts 108 can be disposed adjacent to the outer lateral surface 536 of the substrate 502 or between the surrounding portion 550 and the semiconductor element 104. Referring to FIG. 9, a partial cross-sectional view of a semiconductor package according to other implementations of the invention is shown. In other implementations, the surrounding portion 950 defines at least a surrounding portion through hole 962, and one single conductive part 108 is disposed in a corresponding surrounding portion through hole 962.

In the subsequent singulation step, the singulation path passes through the substrate 502, the package body 506 and the surrounding portion 550 which are stacked together, therefore, the outer lateral surface 536 of the substrate 502, the outer lateral surface 538 of the package body 506 and the outer lateral surface 552 of the surrounding portion 550 are basically aligned with one another.

Figure 10:
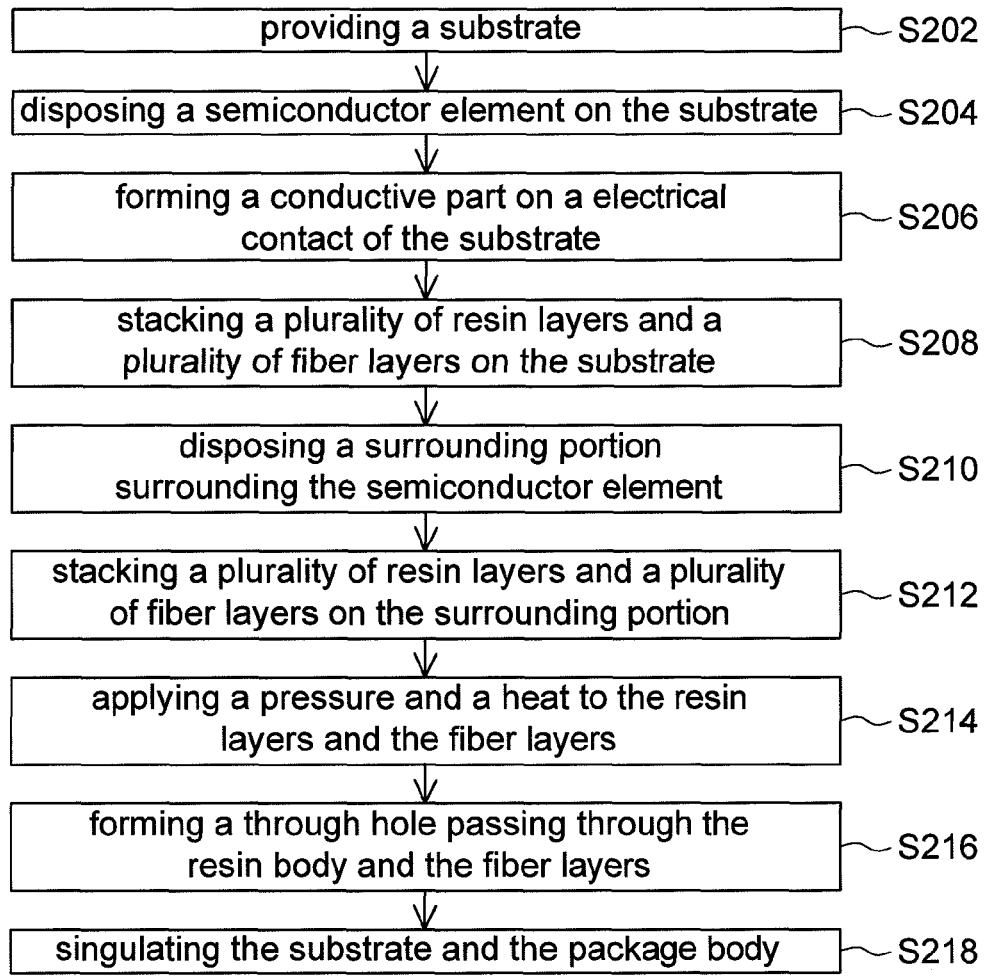
FIG. 10 shows a flowchart of a method for manufacturing semiconductor package according to yet another embodiment of the invention.
Figure 11A:
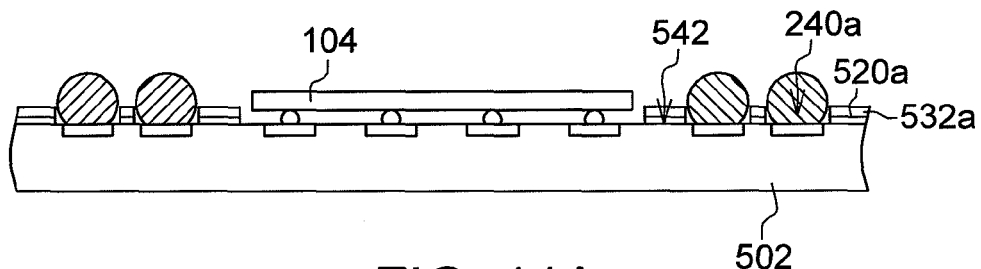
FIGS. 11A-11C show manufacturing processes of the semiconductor package of FIG. 8.
Figure 11B:
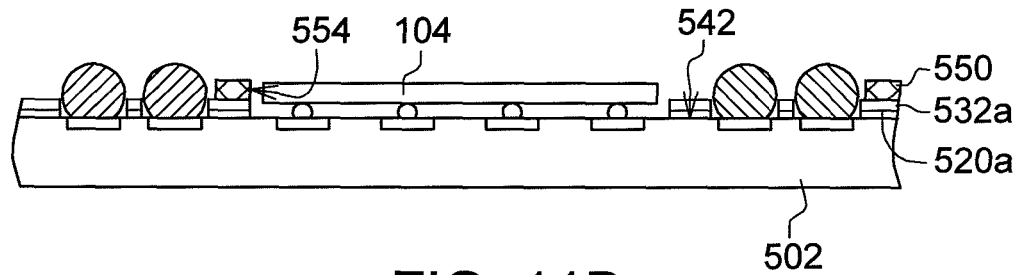
Figure 11C:
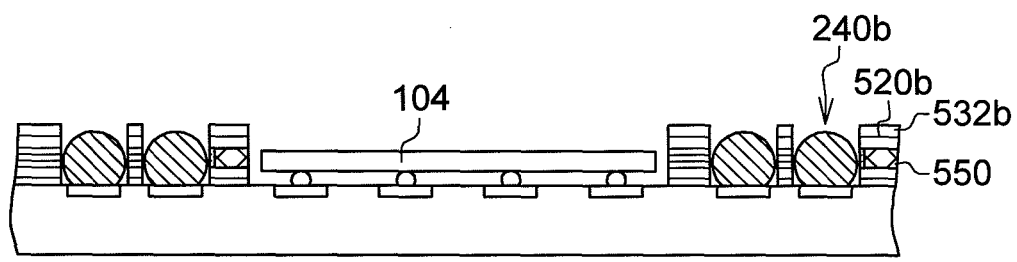

Herebelow, the method for manufacturing the semiconductor package 500 of FIG. 8 is elaborated with FIG. 10 and FIGS. 11A-11C. FIG. 10 shows a flowchart of a method for manufacturing semiconductor package according to yet another embodiment of the invention. FIGS. 11A-11C show manufacturing processes of the semiconductor package of FIG. 8. FIGS. 11A-11C only illustrate the range of one single semiconductor element 104. Steps S202 and S206 for manufacturing the semiconductor package 500 are similar to step S102 and S106 of FIG. 4 and are not repeated here. The elaboration of the method for manufacturing the semiconductor package 500 of FIG. 8 starts with step S208 below.

In step S208, as indicated in FIG. 11A, a plurality of resin layers 532*a* and a plurality of fiber layers 520*a* are stacked on the upper surface 542 of the substrate 502. The resin layers 532*a* and the fiber layers 520*a* define a plurality of second apertures 240*a* from which the conductive parts 108 are exposed. The structure and the stacking manner of the resin layers 532*a* and the fiber layers 520*a* are similar to those of the resin layers 132 and the fiber layers 120 disclosed in the above embodiments, and the similarities are not repeated here.

The second apertures 240*a* can be formed on the resin layers 532*a* and the fiber layers 520*a* by way of laser process, mechanical process or patterning technology.

Then, the method proceeds to step S210, as indicated in FIG. 11B, a plurality of surrounding portions 550 (only one surrounding portions 550 is illustrated in FIG. 11B) is disposed on the resin layers 532*a* and the fiber layers 520*a*, wherein each surrounding portion 550 surrounds a corresponding semiconductor element 104.

Figure 12:
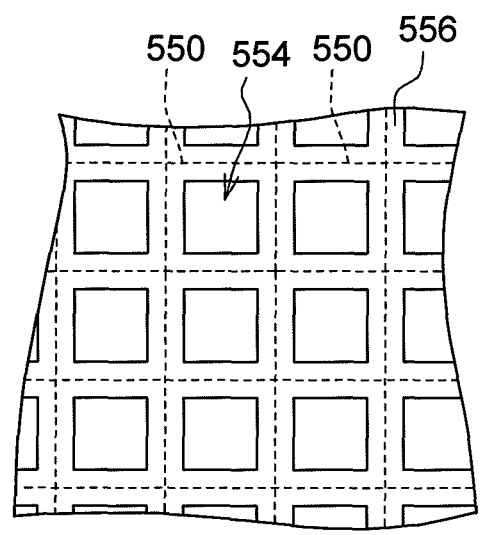
FIG. 12 shows a partial top view of the surrounding portion of FIG. 11B.

The surrounding portions 550 are integrally formed in one piece. Referring to FIG. 12, a partial top view of the surrounding portion of FIG. 11B is shown. The surrounding portions 550 are defined on a metal plate 556, wherein the surrounding portion aperture 554 of each surrounding portion 550 is a through hole in the metal plate 556 for exposing the semiconductor element 104. The through hole of the metal plate 556 can be formed by way of pressing process.

The metal layer can be realized by such as a copper foil with a thickness ranging between 3 μm and 72 μm, but the invention is not limited thereto. Also, the material of the metal plate is not limited to copper, and may include other metals.

Figure 13:
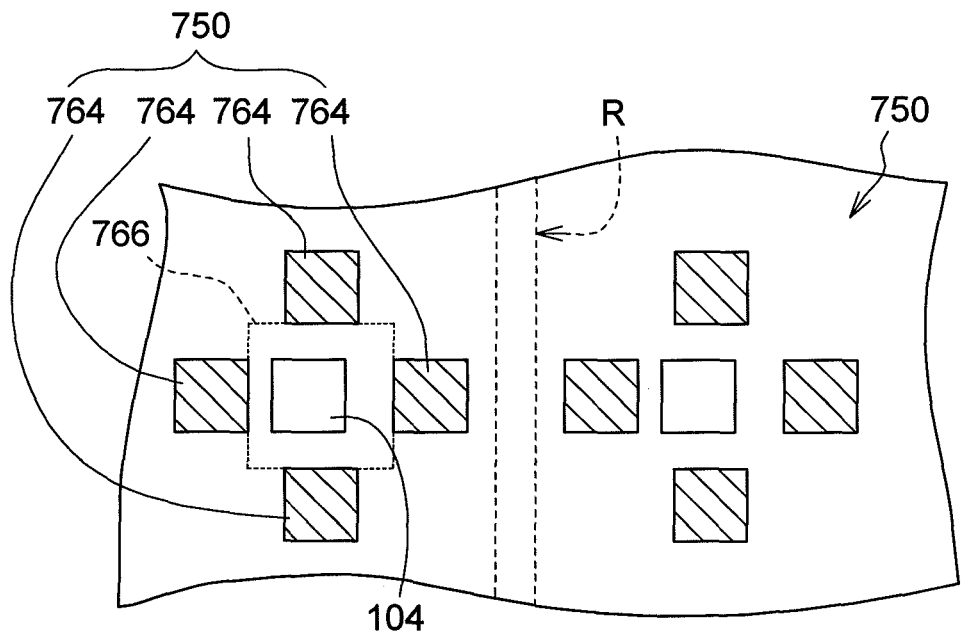
FIG. 13 shows a partial top view of a surrounding portion according to other implementations of the invention.

In the above exemplification, the surrounding portions 550 are defined on the metal plate, but the invention is not limited thereto. Referring to FIG. 13, a partial top view of a surrounding portion according to other implementations of the invention is shown. In an implementation, each surrounding portion 750 includes a plurality of blocks 764, which define or surround an indented portion 766, and the semiconductor element 104 can be disposed in the indented portion 766. Thus, the singulation path can pass through the portion R between two separate blocks 764 without reaching the blocks 764, so that the surrounding portion 750 can be completely enveloped by the package body formed subsequently instead of being exposed form the final semiconductor package.

Figure 14:
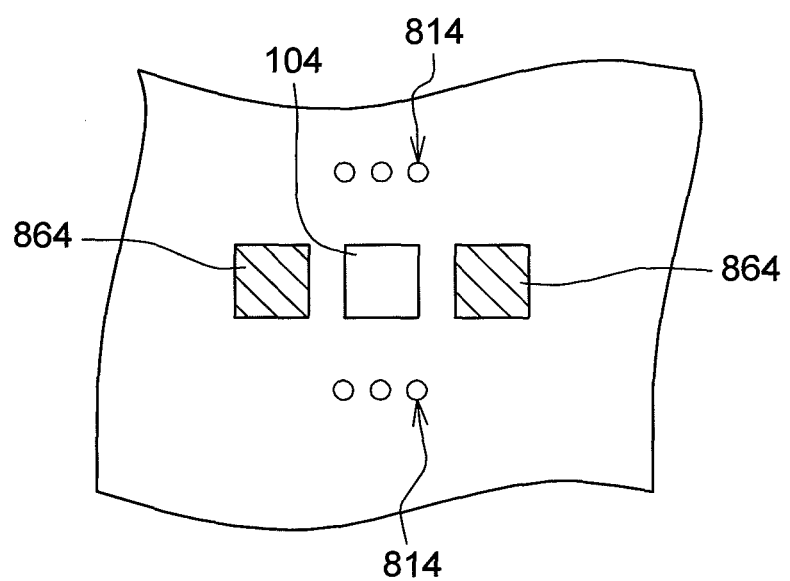
FIG. 14 shows a partial top view of the surrounding portion of a semiconductor package according to other implementations of the invention.

Referring to FIG. 14, a partial top view of the surrounding portion of a semiconductor package according to other implementations of the invention is shown. Each surrounding portion includes two blocks 864 disposed adjacent to two opposite sides of the semiconductor element 104, and at least some of the through holes 814 are adjacent to the other two opposite sides of the semiconductor element 104. Since the two blocks 864 are symmetric, the warpage of the semiconductor package is decreased. However, the invention is not limited to the above exemplification. In other implementations, each surrounding portion may include any suitable number of blocks, and may surround the semiconductor element 104 in any suitable manner.

Then, the method proceeds to step S212, as indicated in FIG. 11C, a plurality of resin layers 532*b* and a plurality of fiber layers 520*b* are stacked on the resin layers 532*a*, the fiber layers 520*a* and the surrounding portion 550. The resin layers 532*b* and the fiber layers 520*b* define a plurality of second apertures 240*b* from which the second apertures 240*a* and the conductive parts 108 are exposed. The structure and the stacking manner of the resin layers 532*b* and the fiber layers 520*b* are similar to those of the resin layers 132 and the fiber layers 120 and the similarities are not repeated here, and the formation method of the second apertures 240*b* is similar to that of the second apertures 240*a* of step S208.

The subsequent steps S214 and S218 are similar to steps S110 and S114 of FIG. 4, and the similarities are not repeated here.

In an implementation, step S206 can be postponed until step S216 is completed.

In step S210 of the method for manufacturing the semiconductor package of FIG. 9, the surrounding portion 950 defines a plurality of surrounding portion through holes 914 from which the conductive parts 108 are exposed, wherein, the surrounding portion through holes 914 can be formed by using cutting tools or by way of laser process.

In the method for manufacturing the semiconductor package of FIG. 9, step S206 can be postponed until step S216 is completed. Under such circumstances, step S216 further comprises the sub-steps of forming the surrounding portion through hole 914 on the surrounding portion 950 by using cutting tools or by way of laser process, so that the electrical contacts 112 of the substrate 902 are exposed from the surrounding portion through hole 914; and forming the conductive parts 108 in the surrounding portion through hole 914 and contacting the corresponding electrical contacts 112.

In step S210, the surrounding portion 550 is disposed on the resin layers 532a and the fiber layers 520a (as indicated in FIG. 8), but the invention is not limited to such exemplification. In an implementation, the method for manufacturing semiconductor package can omit step S208, and in step S210, the surrounding portion 550 is disposed on the upper surface 542 of the substrate 502.

Figure 15:
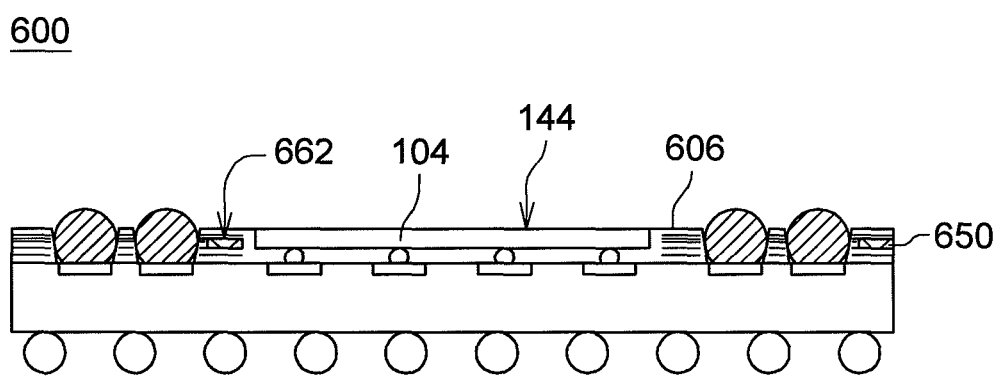
FIG. 15 shows a cross-sectional view of a semiconductor package according to other implementations of the invention.

In the above exemplification, the upper surface 144 of the semiconductor element 104 of the semiconductor package 500 is covered by a portion of the resin body 518b of the package body 506 (as indicated in FIG. 8), but the invention is not limited thereto. Referring to FIG. 15, a cross-sectional view of a semiconductor package according to other implementations of the invention is shown. In other embodiment, the package body 606 of the semiconductor package 600 does not cover the upper surface 144 of the semiconductor element 104, and the upper surface 144 of the semiconductor element 104 is exposed so that the heat generated by the semiconductor element 104 can be quickly dissipated. In other words, as long as the thickness of at least one of the semiconductor element 104 and the surrounding portion 650 is appropriately designed, the semiconductor package 600 as indicated in FIG. 15 can be formed accordingly. Furthermore, in steps S208, S210, S212, as long as the stacking height of the resin layers, the fiber layers and the surrounding portion 650 is not excessively over the upper surface 144 of the semiconductor element 104, the upper surface 144 of the semiconductor element 104 will be exposed after step S214 is completed.

In an embodiment, the method for manufacturing the semiconductor package can omit step S212, so that the upper surface 662 of the surrounding portion 650 is exposed. Given that the thickness of the surrounding portion 650 is appropriately designed, the upper surface 662 of the surrounding portion 650 of the final semiconductor package can be lower than, higher than or basically aligned with the upper surface 144 of the semiconductor element 104.

The semiconductor package and the manufacturing method thereof disclosed in the above embodiments of the invention have many features exemplified below:

(1). The CTE of the substrate is similar to that of the package body, so the entire semiconductor package has smaller warpage.

(2). Due to the superior workability of the package body, after the laser process, the inner lateral wall of the through hole has a smaller gradient, the area of the top opening can be reduced, and the semiconductor package can have more I/O contacts.

(3). The conductive parts of the semiconductor package can be realized by such as conductive pillars and solder balls, and the flexibility in the design of the semiconductor package is increased.

(4). Through the design of the resin layers and the fiber layers, the sealant for enveloping the semiconductor element and the underfill between the semiconductor element and the substrate can be formed at the same time.

(5). The semiconductor package may further include a surrounding portion to enhance the structural strength of the semiconductor package.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package, comprising:
a substrate having an electrical contact;
a semiconductor element disposed on the substrate;
a package body covering at least a portion of the semiconductor element and defining a through hole from which the electrical contact is exposed, wherein the package body comprises a resin body and a plurality of fiber layers disposed in the resin body, and each fiber layer defines a plurality of fiber apertures arranged as an array;
a conductive part electrically connected to the substrate through the through hole; and
a metal layer disposed on the package body, and the semiconductor element is sandwiched between the metal layer and the substrate.

2. The semiconductor package according to claim 1, wherein each fiber layer is formed by glass fiber.

3. The semiconductor package according to claim 1, wherein each fiber layer comprises a plurality of first sub-fiber structures and a plurality of second sub-fiber structures, the first sub-fiber structures and the second sub-fiber structures are interlaced and mutually fixed.

4. The semiconductor package according to claim 1, wherein the conductive part is realized by a conductive pillar or a solder ball.

5. The semiconductor package according to claim 1, wherein the semiconductor element is realized by a flip chip, and a portion of the resin body is interposed between the semiconductor element and the substrate.

6. The semiconductor package according to claim 1, wherein the semiconductor element has an upper surface, and a portion of the resin body covers the upper surface of the semiconductor element.

7. The semiconductor package according to claim 1, wherein the lateral surface of the substrate is aligned with the lateral surface of the package body.

8. The semiconductor package according to claim 1, further comprising:
a surrounding portion surrounding the semiconductor element;
wherein, the package body envelops at least a portion of the surrounding portion.

9. The semiconductor package according to claim 8, wherein the surrounding portion is embedded inside the package body.

10. The semiconductor package according to claim 8, wherein the surrounding portion is defined on a metal plate, and the semiconductor element is disposed in a through hole of the metal plate.

11. The semiconductor package according to claim 8, wherein the surrounding portion includes a plurality of blocks which surround an indented portion, and the semiconductor element is disposed in the indented portion.

12. The semiconductor package according to claim 8, wherein the surrounding portion defines at least a surrounding portion through hole, and one of the conductive part is disposed in a corresponding surrounding portion through hole.

13. The semiconductor package according to claim 8, wherein the semiconductor element has an upper surface, and the stacking height of the package body and the surrounding portion is not over the upper surface of the semiconductor element.

14. The semiconductor package according to claim 13, wherein the upper surface is exposed from the package body.

15. The semiconductor package according to claim 1, wherein the conductive part is disposed on the electrical contact, and a space is defined between a junction between the through hole and the electrical contact and a sidewall of the conductive part.

16. The semiconductor package according to claim 1, further comprising a plurality of solder balls disposed on the substrate and electrically connected to the electrical contact through the substrate.

17. The semiconductor package according to claim 1, wherein each of the fiber layers is a sheet-like fiber layer.

18. The semiconductor package according to claim 1, wherein each fiber layer comprises a plurality of first strip fibers and a plurality of second strip fibers, the first and the second strip fibers are interlaced and mutually fixed at the interlacing part.

19. The semiconductor package according to claim 18, wherein each of the first strip fibers comprises first parts passing through the upper part of the second strip fibers and second parts passing through the lower part of the second strip fibers, one of the second parts is connected between two neighboring first parts.

* * * * *